(12) United States Patent
Eom (10) Patent No.: US 10,074,664 B2
(45) Date of Patent: Sep. 11, 2018

(54) SEMICONDUCTOR MEMORY DEVICE INCLUDING SLIMMING STRUCTURE

(71) Applicant: SK hynix Inc., Gyeonggi-do (KR)

(72) Inventor: Dae Sung Eom, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/879,971

(22) Filed: Oct. 9, 2015

(65) Prior Publication Data
US 2016/0351672 A1     Dec. 1, 2016

(30) Foreign Application Priority Data

May 26, 2015   (KR) ........................ 10-2015-0073033

(51) Int. Cl.
| H01L 29/792 | (2006.01) |
| H01L 27/11582 | (2017.01) |
| H01L 27/11565 | (2017.01) |
| H01L 27/1157 | (2017.01) |
| H01L 27/11573 | (2017.01) |
| H01L 27/11575 | (2017.01) |
| H01L 27/11556 | (2017.01) |

(52) U.S. Cl.
CPC .... *H01L 27/11582* (2013.01); *H01L 27/1157* (2013.01); *H01L 27/11565* (2013.01); *H01L 27/11573* (2013.01); *H01L 27/11575* (2013.01); *H01L 27/11556* (2013.01); *H01L 29/7926* (2013.01)

(58) Field of Classification Search
CPC ......... H01L 27/11534; H01L 27/11536; H01L 27/10894; H01L 27/11573; H01L 27/11556; H01L 27/11582; H01L 27/11551; H01L 27/11578; H01L 27/11512; H01L 27/11548; H01L 27/11575; H01L 27/11595; H01L 29/7926; H01L 27/1157; H01L 29/792; H01L 27/0688; G11C 16/0483; G11C 5/025

USPC .......... 257/314, 324, 326, E21.423, E29.309
See application file for complete search history.

(56) References Cited

U.S. PATENT DOCUMENTS 9,443,868 B1 *  9/2016  Hu .................... H01L 27/11582
2009/0267128 A1 * 10/2009 Maejima ........... H01L 27/11565
                                                                    257/314

(Continued)

FOREIGN PATENT DOCUMENTS

KR   1020120121177   11/2012
KR   1020140052398    5/2014

*Primary Examiner* — David Chen
(74) *Attorney, Agent, or Firm* — IP & T Group LLP (57) ABSTRACT

Disclosed is a semiconductor memory device, including: a slimming structure extended from a cell structure in a direction parallel to the semiconductor substrate, the cell structure having a plurality of cell transistors stacked over a semiconductor substrate; vertical insulating materials extended in a direction crossing the semiconductor substrate and configured to divide the cell structure and the slimming structure into a plurality of memory blocks; contact plugs passing through the vertical insulating materials, respectively, within an area in which the slimming structure is formed; and junctions formed within the semiconductor substrate under the vertical insulating materials, in which the junctions are coupled to the contact plugs, respectively.

21 Claims, 8 Drawing Sheets

(56) References Cited

U.S. PATENT DOCUMENTS

| | | | |
|---|---|---|---|
| 2010/0038703 A1* | 2/2010 | Fukuzumi | G11C 5/02 257/326 |
| 2011/0013454 A1* | 1/2011 | Hishida | G11C 5/02 365/185.11 |
| 2012/0273965 A1* | 11/2012 | Seo | H01L 27/11565 257/774 |
| 2014/0110795 A1* | 4/2014 | Oh | H01L 27/11573 257/401 |
| 2015/0041901 A1* | 2/2015 | Son | G11C 16/0483 257/368 |

* cited by examiner

SEMICONDUCTOR MEMORY DEVICE INCLUDING SLIMMING STRUCTURE

CROSS-REFERENCE TO RELATED APPLICATION

The present application claims priority to Korean patent application number 10-2015-0073033 filed on May 26, 2015, the entire disclosure of which is herein incorporated by reference.

BACKGROUND

1. Field

The present disclosure relates to an electronic device, and more particularly, to a semiconductor memory device.

2. Discussion of Related Art

A semiconductor memory device is a memory device implemented by using a semiconductor, such as silicon (Si), germanium (Ge), gallium arsenide (GaAs), an indium phosphide (InP). The semiconductor memory device is generally classified as a volatile memory device or a nonvolatile memory device.

The volatile memory device is a memory device in which stored data disappears when a power supply is interrupted. The volatile memory device includes a Static RAM (SRAM), a Dynamic RAM (DRAM), a Synchronous DRAM (SDRAM), and the like. The nonvolatile memory device is a memory device in which stored data is maintained even though a power supply is interrupted. The nonvolatile memory device includes a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory generally includes a NOR type and a NAND type.

SUMMARY

The present disclosure has been made in an effort to provide a semiconductor memory device having an improved degree of integration. An exemplary embodiment of the present disclosure provides a semiconductor memory device, including: a slimming structure extended from a cell structure in a direction parallel to the semiconductor substrate, the cell structure having a plurality of cell transistors stacked over a semiconductor substrate; vertical insulating materials extended in a direction crossing the semiconductor substrate and configured to divide the cell structure and the slimming structure into a plurality of memory blocks; contact plugs passing through the vertical insulating materials, respectively, within an area in which the slimming structure is formed; and junctions formed within the semiconductor substrate under the vertical insulating materials. The junctions may be coupled to the contact plugs, respectively.

The plurality of memory blocks may include conductive layers adjacent to the semiconductor substrate the area in which the slimming structure is formed, and the conductive layers and the junctions are formed transistors.

The plurality of cell transistors may be coupled between bit lines and a common source line, and first contact plugs among the contact plugs may be coupled to the common source line, the remaining second contact plugs among the contact plugs may be coupled to a ground, and the transistors may be coupled between the first contact plugs and the second contact plugs.

The plurality of memory blocks may include conductive layers coupled to the plurality of cell transistors, and interlayer insulating layers alternately stacked with the conductive layers, and the junctions and lower conductive layers adjacent to the semiconductor substrate among the conductive layers may be formed source line discharge transistors.

The plurality of cell transistors may be coupled between bit lines and a common source line, and first contact plugs among the contact plugs may be coupled to the common source line, the remaining second contact plugs among the contact plugs may be coupled to a ground, and the source line discharge transistors may be coupled between the first contact plugs and the second contact plugs.

The lower conductive layers may be pipe gates coupled to pipe selection transistors among the plurality of cell transistors.

The pipe selection transistors and the source line discharge transistors may be commonly coupled to the pipe gate, and when a turn-on voltage is applied to the pipe gate, the pipe selection transistors and the source line discharge transistors may be turned on.

The slimming structure may extend to a selection line contact area, a dummy area, and a word line contact area from the cell structure, the slimming structure in the selection line contact area and the word line contact area may be in a step form, and the slimming structure in the dummy area may have no step. The vertical insulating materials may extend to the selection line contact area, the dummy area, and the word line contact area from the cell structure, and the contact plugs may pass through the vertical insulating materials in the dummy area, respectively.

Another exemplary embodiment of the present disclosure provides a semiconductor memory device, including: a slimming structure including conductive layers and interlayer insulating layers, wherein the conductive layers are coupled to a plurality of cell transistors, wherein the plurality of cell transistors are stacked over a semiconductor substrate, and wherein the Interlayer insulating layers are alternately disposed with between the conductive layers; first and second vertical insulating materials extended in a direction crossing an upper surface of the semiconductor substrate, and respectively disposed at both first and second sides of the slimming structure; first and second contact plugs passing through the first and second vertical insulating materials, respectively, within an area, in which the slimming structure is formed; and first and second junctions formed within the a semiconductor substrate under the first and second vertical insulating materials, respectively. The first and second junctions are coupled with the first and second contact plugs, respectively.

Still another exemplary embodiment of the present disclosure provides a semiconductor memory device, including: first and second vertical insulating materials provided over a substrate; a stack including a pipe gate and a slimming structure and provided over the substrate between the first and the second vertical insulating materials; first and second junctions respectively formed in the substrate under the first and the second vertical insulating materials, wherein the first and second junctions and the pipe gate form a source line discharge transistor; and first and second contact plugs respectively passing through the first and the second vertical insulating materials, and are respectively coupled to the first and the second junctions.

According to the exemplary embodiments of the present disclosure, it is possible to provide a semiconductor memory device having an improved degree of integration.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present disclosure will become more apparent to those of ordinary skill in the art by describing in detail embodiments thereof with reference to the attached drawings in which.

DETAILED DESCRIPTION

Hereinafter, exemplary embodiments according to the present disclosure will be described in detail with reference to the accompanying drawings. In the description below, it should be noted that only parts necessary for understanding operations according to various exemplary embodiments of the present disclosure will be described, and descriptions of other parts may be omitted so as to avoid unnecessarily obscuring the subject matter of the present disclosure. However, the present disclosure is not limited to the exemplary embodiments described herein, and may be implemented in various different forms. The exemplary embodiments described herein are provided so as to describe the present disclosure in detail so that those skilled in the art may easily carry out the technical spirit of the present disclosure.

Throughout this specification and the claims that follow, when it is described that an element is "coupled" to another element, the element may be "directly coupled" to the other element or "Indirectly coupled" to the other element through a third element. Throughout the specification and the claims, unless explicitly described to the contrary, the word "comprise" and variations such as "comprises" or "comprising" will be understood to imply the inclusion of stated elements but not the exclusion of any other elements.

Figure 1:
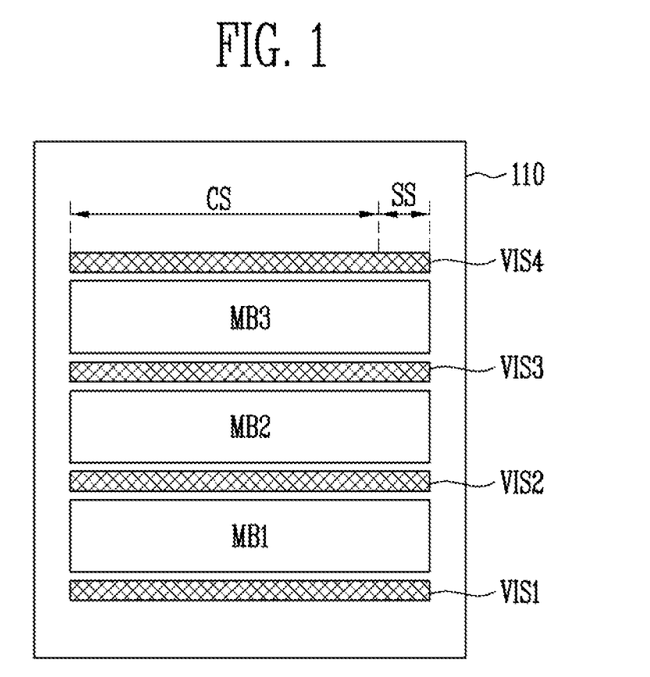
FIG. 1 is a top plan view illustrating a memory cell array according to an exemplary embodiment of the present disclosure.

FIG. 1 is a top plan view Illustrating a memory cell array 110 according to an exemplary embodiment of the present disclosure.

Referring to FIG. 1, the memory cell array 110 includes a plurality of memory blocks MB1 to MB3. In FIG. 1, for convenience of description, it is illustrated that three memory blocks MB1 to MB3 are provided within the memory cell array 110, but this is illustrative, and it may be understood that the memory cell array 110 may include more or less memory blocks.

The plurality of memory blocks MB1 to MB3 is separated by a plurality of vertical insulating materials VIS1 to VIS4. The memory cell array 110 is divided into a cell structure CS and a slimming structure SS. The cell structure CS includes a plurality of cell transistors stacked over a semiconductor substrate. The plurality of cell transistors may be connected between bit lines BL (see FIG. 6) and a common source line CSL. As an exemplary embodiment, each of the plurality of cell transistors may be used as any one of a source selection transistor, a memory cell, a pipe selection transistor, and a drain select transistor.

The cell structure CS includes conductive layers connected to the plurality of cell transistors and interlayer insulating layers for separating the conductive layers. The conductive layers connected to the plurality of cell transistors are extended from the cell structure CS to the slimming structure SS. The slimming structure SS is patterned in a step form.

According to the exemplary embodiment of the present disclosure, contact plugs passing through the vertical insulating materials VIS1 to VIS4, respectively, are provided. Each of the source contact plugs may be formed in a direction vertical to the semiconductor substrate.

Figure 2:
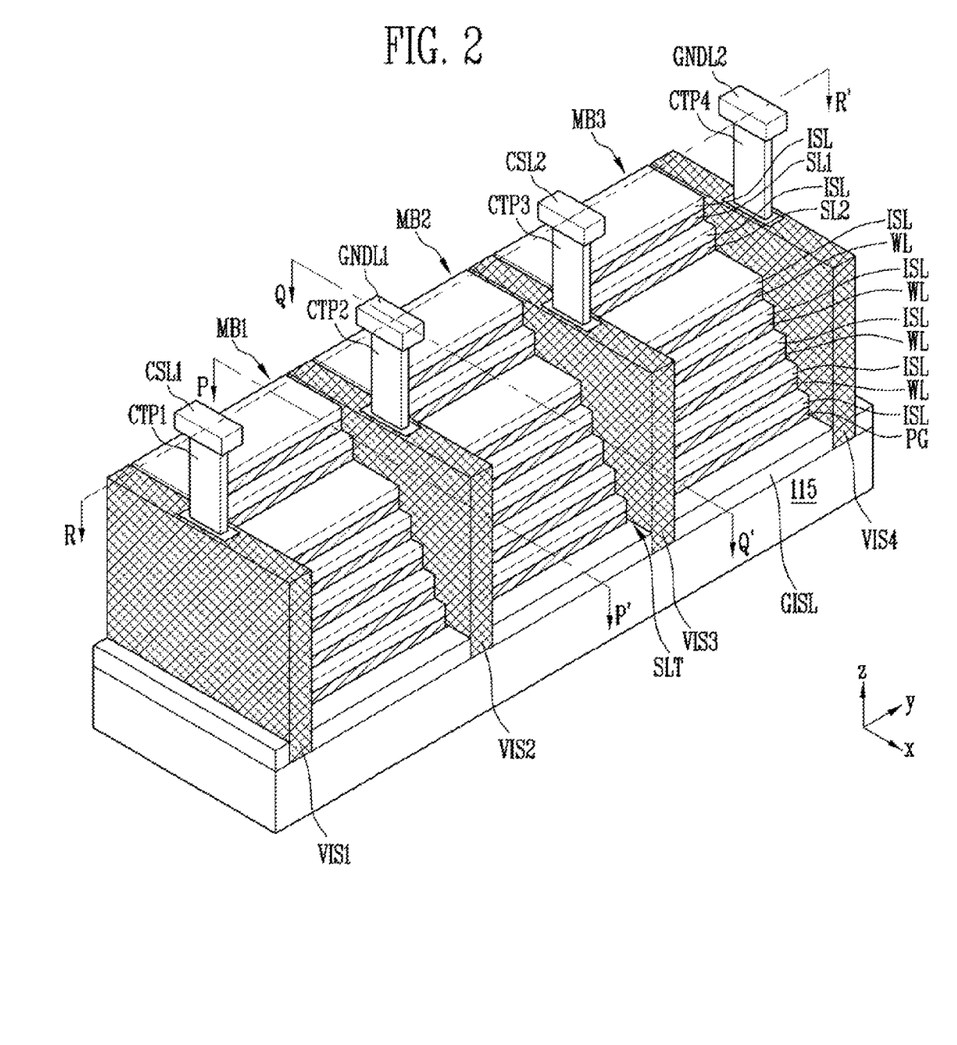
FIG. 2 is a schematic perspective view illustrating a slimming structure of FIG. 1.

FIG. 2 is a schematic perspective view illustrating the slimming structure SS of FIG. 1. Referring to FIG. 2, the slimming structure SS includes a gate insulating layer GISL, a plurality of conductive layers PG, WL, SL1, and SL2, interlayer insulating layers ISL, first to fourth vertical insulating materials VIS1 to VIS4, and first to fourth contact plugs CTP1 to CTP4.

A semiconductor substrate 115 is provided. The semiconductor substrate 115 may be formed of a material usable as a junction according to an injection of impurities. Although not illustrated in FIG. 2, it may be understood that a separate substrate may be further provided under the semiconductor substrate 115. For example, the semiconductor substrate 115 may be formed of a polysilicon layer.

The slimming structure is formed on the semiconductor substrate 115. The slimming structure SS is extended in an x-direction from the cell structure CS (see FIG. 1).

According to the exemplary embodiment of the present disclosure, the gate insulating layer GISL is formed on the semiconductor substrate 115. The gate insulating layer GISL is disposed between the lower conductive layer PG and the semiconductor substrate 115.

The conductive layers PG, WL, SL1, and SL2 and the interlayer Insulating layers ISL are alternately stacked on the gate insulating layer GISL. The interlayer insulating layers ISL separate the conductive layers PG, WL, SL1, and SL2 from each other.

The lower conductive layer PG adjacent to the semiconductor substrate 115 among the plurality of conductive layers PG, WL, SL1, and SL2 may be defined as a pipe gate and is connected with the pipe selection transistor among the cell transistors of the cell structure CS. The first conductive layers SL1 and SL2 among the plurality of conductive layers PG, WL, SL1, and SL2 may be defined as selection lines and are connected with the selection transistors among the cell transistors. The second conductive layers WL among the plurality of conductive layers PG, WL, SL1, and SL2 may be defined as word lines and are connected with the memory cells among the cell transistors.

The vertical insulating materials VIS1 to VIS4 extending in the x-direction and a y-direction are provided. The slimming structure SS and the cell structure CS are divided into the first to third memory blocks MB1 to MB3 by the first to fourth vertical insulating materials VIS1 to VIS4. Slits SLT are formed between the first to third memory blocks MB1 to MB3, and the first to fourth vertical insulating materials VIS1 to VIS4 may be provided within the slits SLT. The first to fourth vertical insulating materials VIS1 to VIS4 may be in contact with the semiconductor substrate 115 while passing through the gate insulating layer GISL, the plurality of conductive layers PG, WL, SL1, and SL2, and the interlayer insulating layers ISL. Each of the first to third memory blocks MB1 to MB3 has the gate insulating layer GISL, the plurality of conductive layers PG, WL, SL1, and SL2, and the interlayer insulating layers ISL isolated from each other by the first to fourth vertical insulating materials VIS1 to VIS4.

FIG. 2 illustrates that the slimming structure SS of each memory block is extended in the y-direction and is not cut. However, this is exemplary, and it may be understood that the slimming structure SS may be cut in various manners according to an arrangement of the cell transistors of the memory block within the cell structure CS. For example, a layer at a specific height of the slimming structure SS may be separated into a plurality of elements arranged in the y-direction.

According to the exemplary embodiment of the present disclosure, contact plugs CTP1 to CTP4 passing through the vertical insulating materials VIS1 to VIS4, respectively, are provided. First, holes passing through the first to fourth vertical insulating materials VIS1 to VIS4 in a z-direction may be provided. The first to fourth contact plugs CTP1 to CPT4 may be formed within the holes. The first to fourth contact plugs CTP1 to CPT4 are in contact with the semiconductor substrate 115.

Some of the first to fourth contact plugs CTP1 to CPT4 may be connected to the common source line CSL1 and CSL2, and the remainder among the first to fourth contact plugs CTP1 to CPT4 may be connected to ground lines GNDL1 and GNDL2. In FIG. 2, it is illustrated that the first to fourth contact plugs CTP1 to CPT4 are connected to the first common source line CSL1, the first ground line GNDL1, the second common source line CSL2, and the second ground line GNDL2.

As an exemplary embodiment, the first and second common source lines CSL1 and CSL2 may be connected to each other. The first and second ground lines GNDL1 and GNDL2 may be connected to each other.

Figure 3:
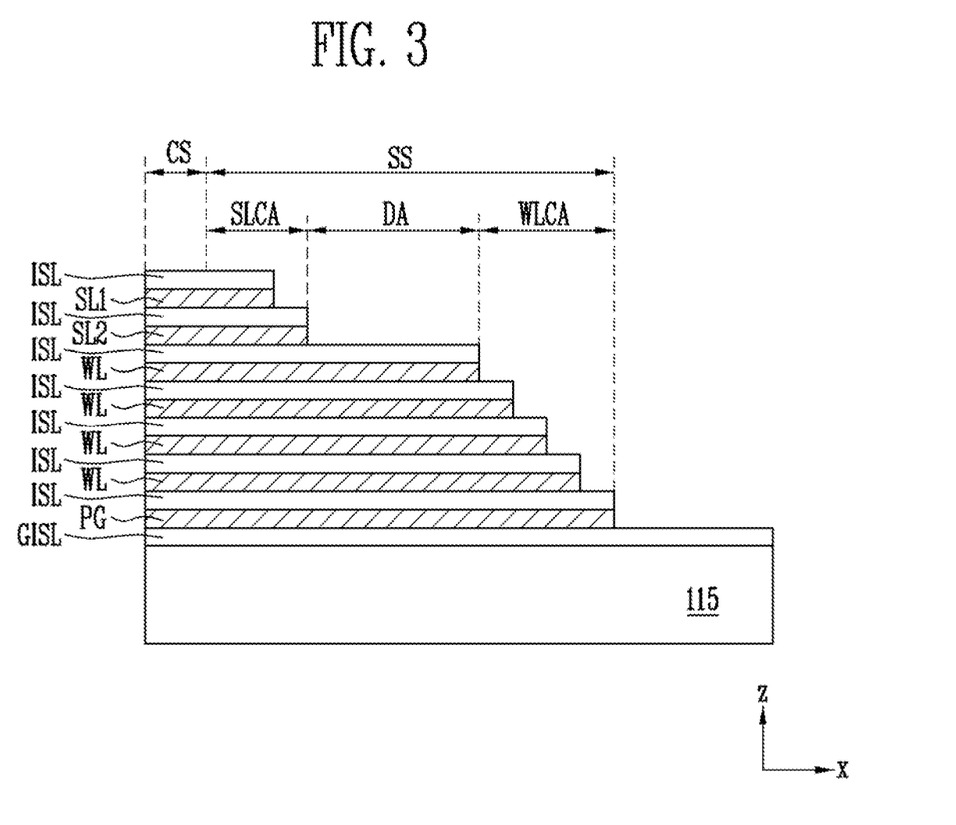
FIG. 3 is a cross-sectional view taken along line P-P' of FIG. 2.

FIG. 3 is a cross-sectional view taken along line P-P' of FIG. 2. Referring to FIG. 3, the gate insulating layer GISL is formed on the semiconductor substrate 115. A pipe gate PG is formed on the gate insulating layer GISL. The interlayer insulating layers ISL and the word lines WL are stacked on the pipe gate PG. Further, selection lines SL1 and SL2 and the interlayer insulating layers ISL are stacked.

As illustrated in FIGS. 2 and 3, the slimming structure SS is extended from the cell structure CS to a selection line contact area SLCA, a dummy area DA, and a word line contact area WLCA. The slimming structure SS is patterned in a step form in the selection line contact area SLCA and the word line contact area WLCA. During a slimming process, an etching process may be repeated while gradually decreasing a width of a photoresist pattern so that steps may be generated between the conductive layers PG, WL, SL1, and SL2.

Although not illustrated in FIG. 3, the selection lines SL1 and SL2 may be connected with a peripheral circuit 120 (see FIG. 8) through the contact structures extended from the selection line contact area SLCA in the z-direction. The word lines WL and the pipe gate PG may be connected with the peripheral circuit 120 through the contact structures extended from the word line contact area WLCA in the z-direction.

The dummy area DA may be provided between the selection line contact area SLCA and the word line contact area WLCA. See FIG. 2. In the dummy area DA, the slimming structure SS is not patterned in a step form. The slimming structure SS has the same height in the dummy area DA. When the semiconductor memory device turns on, voltages applied to the word lines WL are different from voltages applied to the selection lines SL1 and SL2. When the dummy area DA is provided, interference between the voltages applied to the word lines WL and the voltages applied to the selection lines SL1 and SL2 is decreased.

Figure 4:
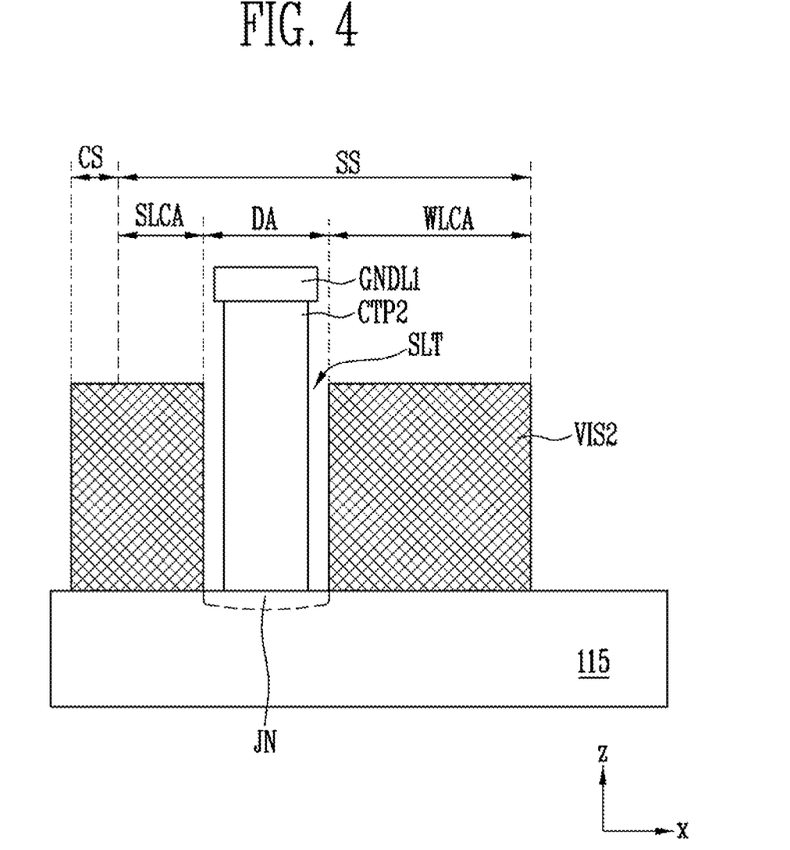
FIG. 4 is a cross-sectional view taken along line Q-Q' of FIG. 2.

FIG. 4 is a cross-sectional view taken along line Q-Q' of FIG. 2. Referring to FIG. 4, a junction JN is formed within the semiconductor substrate 115 under the vertical insulating material VIS2. For example, the semiconductor substrate 115 may be a polysilicon layer, and the junction JN may be formed by injecting impurities into the polysilicon layer.

FIG. 4 illustrates that the junction IN is formed in the semiconductor substrate 115 located in the dummy area DA. However, this is illustrative, and the present disclosure is not limited thereto. In order for the transistor including the junction 3N to smoothly transmit current, the junction IN may have a longer width than that of the dummy area DA.

The vertical Insulating material VIS2 is extended from the semiconductor substrate 115 in the z-direction. The slit SLT is formed in the slimming structure SS and in the vertical Insulating material VIS2. The contact plug CTP2 may be provided within the slit SLT. The contact plug CTP2 may be connected with the junction 3N and passes through the vertical insulating material VIS2.

As illustrated in FIG. 4, the contact plug CTP2 connected with the junction IN and passing through the vertical insulating material VIS2 may be provided within the dummy area DA. As described with reference to FIG. 3, the slimming structure SS in the dummy area DA is not patterned in a step form. Further, the contact structures extended in the z-direction are not provided within the dummy area DA. Instead, the contact structures extended in the z-direction may be provided in the selection line contact area SLCA and the word line contact area WLCA. Accordingly, the contact plug CTP2 within the dummy area DA is relatively far from the contact structures extended in the z-direction. Accordingly, when the contact plug CTP2 is formed within the dummy area DA, interference between the contact plug CTP2 and the contact structures extended in the z-direction may be decreased.

In FIG. 4, the plate-shaped contact plug CTP2 is provided within the vertical insulating material VIS2. However, the present disclosure is not limited thereto. For example, a plurality of separated contact plugs may be formed within the vertical Insulating material VIS2. The plate-shaped contact plug CTP2 or the plurality of separated contact plugs is provided so that the transistor including the junction JN may transmit a relatively large current. When the transistor including the junction JN is used as a source line discharge transistor, a bouncing phenomenon of the common source line is improved.

Figure 5:
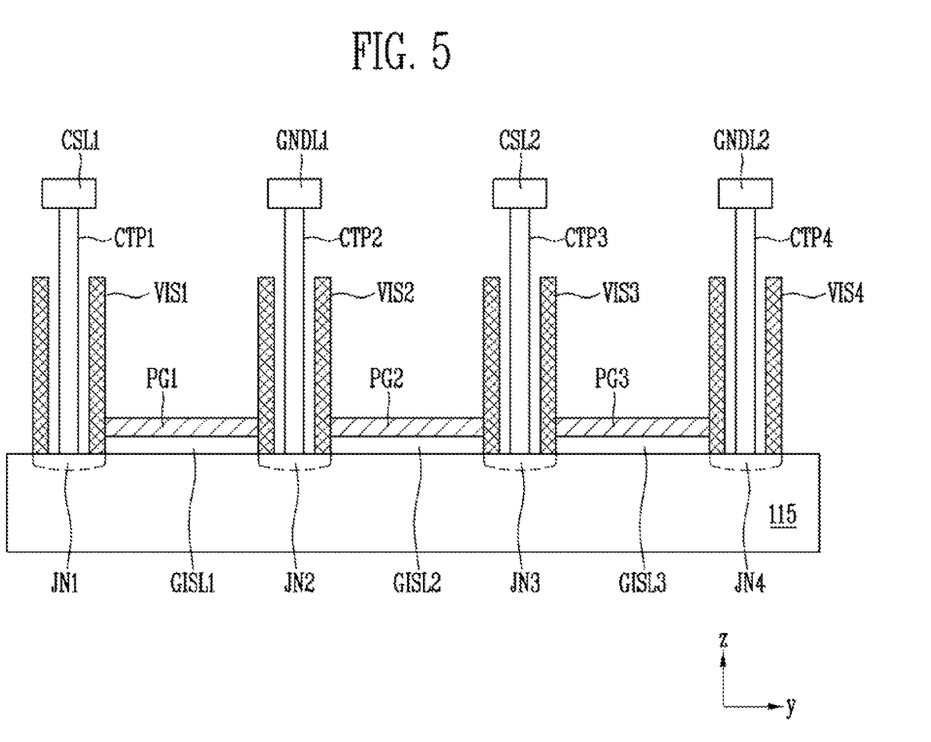
FIG. 5 is a cross-sectional view taken along line R-R' of FIG. 2.

FIG. 5 is a cross-sectional view taken along line R-R' of FIG. 2. Referring to FIG. 5, junctions 3N1 to 3N4 are formed in the semiconductor substrate 115 under the vertical insulating materials VIS1 to VIS4. The first to fourth junctions JN1 to JN4 are connected to the first to fourth contact plugs CTP1 to CTP4, respectively.

First to third gate insulating layers GISL1 to GISL3 (see the gate insulating layer GISL of FIG. 2) are provided on the semiconductor substrate 115. The first to third gate insulating layers GISL1 to GISL3 correspond to the first to third memory blocks MB1 to MB3, respectively.

The first to third pipe gates PG1 to PG3 are provided on the first to third gate insulating layers GISL1 to GISL3, respectively. The first to third pipe gates PG1 to PG3 correspond to the first to third memory blocks MB1 to MB3, respectively.

In FIG. 5, the interlayer insulating layers and the conductive layers are omitted. Although not shown, it may be understood that five interlayer insulating layers ISL and four word lines WL may be shown when viewed as the cross-section taken along line R-R'.

According to the exemplary embodiment of the present disclosure, the first and second junctions JN1 and JN2 and the first pipe gate PG1 may be operated as the source line discharge transistor of the first memory block MB1 hereinafter, referred to as a "first source line discharge transistor". The second and third junctions JN2 and JN3 and the second pipe gate PG2 may be operated as the source line discharge transistor of the second memory block MB2 hereinafter, referred to as a "second source line discharge transistor". The third and fourth junctions JN3 and JN4 and the third pipe gate PG3 may be operated as the source line discharge transistor of the third memory block MB3 hereinafter, referred to as a "third source line discharge transistor".

The first source line discharge transistor is connected between the first common source line CSL1 and the first ground line GNDL1. The first source line discharge transistor may electrically connect the first common source line CSL1 and the first ground line GNDL1 in response to a voltage applied to the pipe gate PG1. The second source line discharge transistor may electrically connect the second common source line CSL2 and the first ground line GNDL1 in response to a voltage applied to the pipe gate PG2. The third source line discharge transistor may electrically connect the second common source line CSL2 and the second ground line GNDL2 In response to a voltage applied to the pipe gate PG3.

In order for the source line discharge transistor including the junction to smoothly transmit a current, a width of each of the first to fourth junctions JN1 to JN4 in the y-direction may be increased. For example, a width of each of the vertical insulating materials VIS1 to VIS4 in the y-direction is larger in an area, in which the slimming structure SS is formed, than in an area, in which the cell structure CS is formed. The junctions JN1 to JN4 may be formed under the vertical insulating materials VIS1 to VIS4 each having the larger width.

According to the exemplary embodiment of the present disclosure, an additional transistor may be provided under the slimming structure. Accordingly, a degree of integration of the memory cell array is improved.

According to the exemplary embodiment of the present disclosure, an additional transistor is provided in a relatively larger area such as, the area corresponding to the slimming structure of one memory block. The amount of current transmittable by a corresponding transistor may be large. The amount of current transmittable by a corresponding transistor may be adjusted by adjusting a width of a junction and a width of a pipe gate of the corresponding transistor.

The first pipe gate PG1 is connected with gates of the pipe selection transistors of the first memory block MB1. The second pipe gate PG2 is connected with gates of the pipe selection transistors of the second memory block MB2. The third pipe gate PG3 is connected with gates of the pipe selection transistors of the third memory block MB3. That is, the gates of the pipe selection transistors within the memory block and the gate of the additional transistor may be commonly connected to the pipe gate. Accordingly, wires for controlling the pipe selection transistors and the source line discharge transistors may be decreased. Therefore, a degree of integration of the memory cell array is improved.

Furthermore, when a turn-on voltage is applied to any one of the pipe gates PG1 to PG3, the corresponding additional transistor to which the turn-on voltage is applied, is turned on and the pipe selection transistors connected with the pipe gate also turn on. For example, the additional transistor and the pipe selection transistors are equally biased during a read operation, a program operation, and a write operation of the semiconductor memory device. The gates of the pipe selection transistors and the gates of the additional transistors may be controlled by one common control unit. Accordingly, an occupied area of the semiconductor memory device including the memory cell array 110 is decreased.

Figure 6:
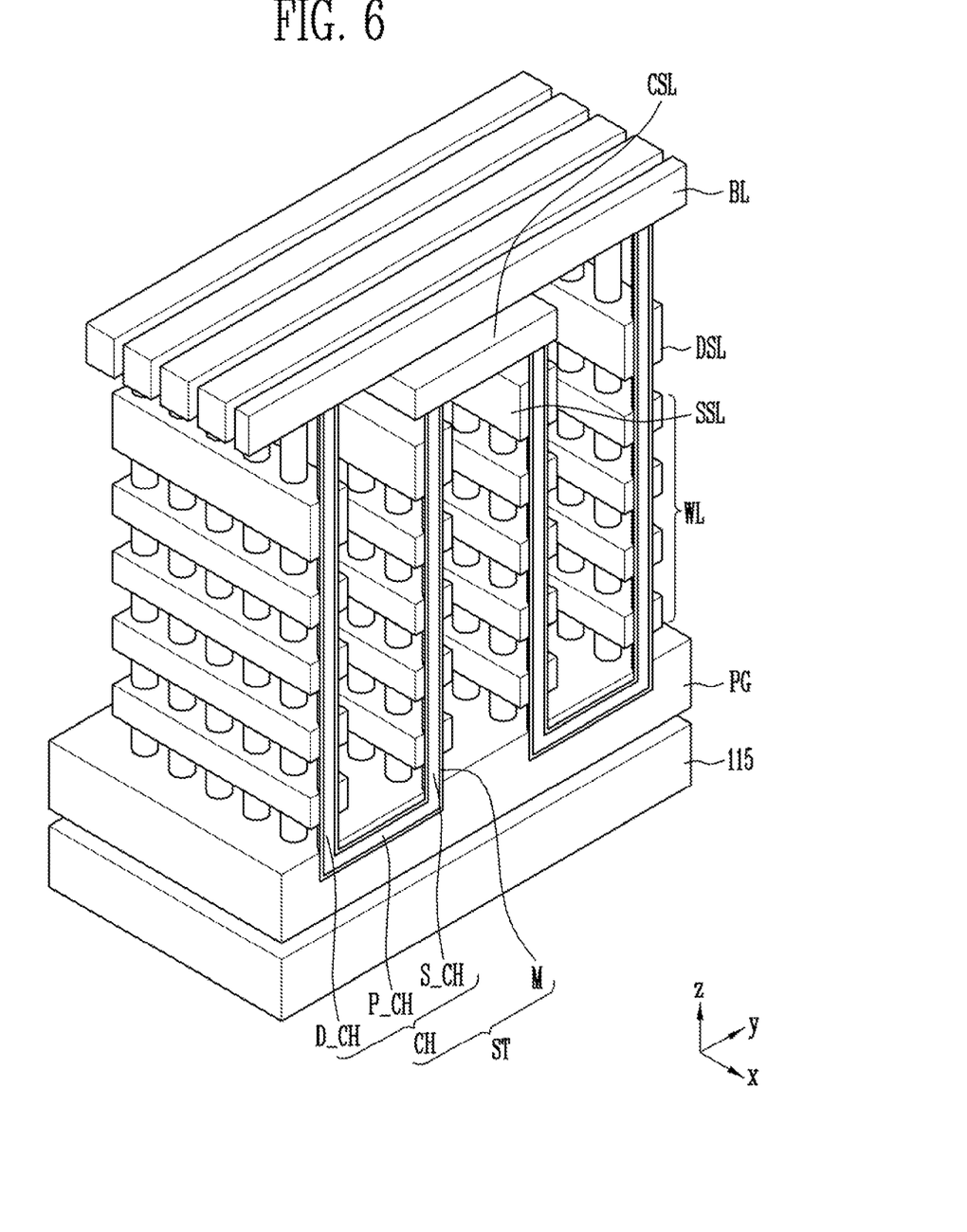
FIG. 6 is a perspective view illustrating one exemplary embodiment of a cell structure of any one of the memory blocks of FIG. 1.

FIG. 6 is a perspective view illustrating one exemplary embodiment of the cell structure CS of any one of the memory blocks MB1 to MB3 of FIG. 1. As illustrated in FIG. 6, the cell structure may include a pipe gate PG, word lines WL, a source selection line SSL, and a drain selection line DSL stacked on a substrate 115. The source selection line SSL and the drain selection line DSL may correspond to the first and second selection lines SL1 and SL2 of FIG. 2.

Figure 7:
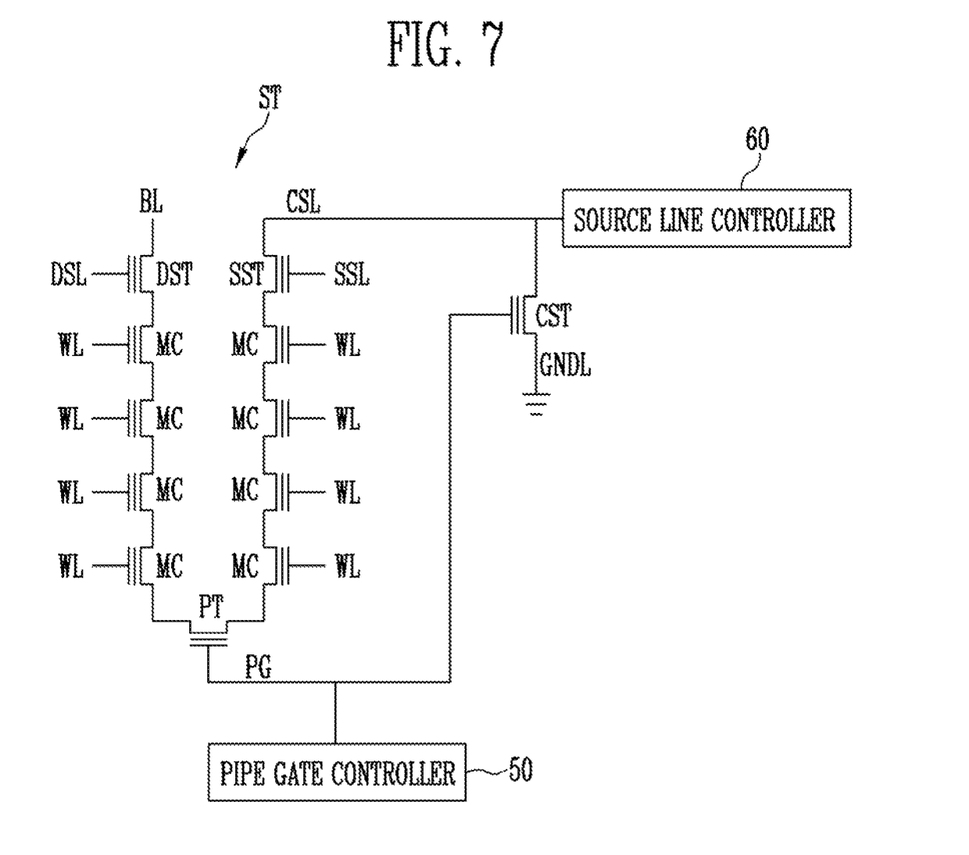
FIG. 7 is a block diagram illustrating one cell string and a corresponding source line discharge transistor within any one memory block among the memory blocks of FIG. 1.

Interlayer insulating layers ISL (see FIG. 2) are provided between the pipe gate PG, the word lines WL, the source selection line SSL, and the drain selection line DSL. A gate insulating layer GISL (see FIG. 2) is provided between the pipe gate PG and the semiconductor substrate 115. In FIG. 7, for convenience of illustration, the interlayer insulating layers ISL and the gate insulating layer GISL are omitted.

The cell structure includes a U-shaped cell string ST. The cell string ST includes a channel layer CH and one or more insulating layers M surrounding the channel layer CH. The one or more insulating layers M may include a tunnel insulating layer, a data storage layer, and a blocking insulating layer. The data storage layer may be formed to surround the tunnel insulating layer, and the blocking insulating layer may be formed to surround the data storage layer. The tunnel insulating layer includes a silicon oxide layer. The data storage layer includes a silicon oxide layer allowing charge trap. The blocking insulating layer may include at least one of a silicon oxide layer and a high dielectric layer having a higher dielectric constant than that of the silicon oxide.

The channel layer CH includes a pipe channel layer P_CH, and a source side channel layer S_CH and a drain side channel layer D_CH protruding from the pipe channel layer P_CH. In FIG. 6, one pair of source side channel layer S_CH and drain side channel layer D_CH is connected to the pipe channel layer P_CH. However, in another embodiment, two or more source side channel layers S_CH may be connected to the pipe channel layer P_CH, and two or more drain side channel layers D_CH may be connected to the pipe channel layer P_CH.

The source side channel layer S_CH passes through the word lines WL and the source selection line SSL, and the drain side channel layer D_CH pass through the word lines WL and the drain selection line DSL. The source side channel layer S_CH is connected with a common source line CSL, and the drain side channel layer D_CH is connected with any one of the bit lines BL.

One cell transistor may be defined in an area, in which any one of the row lines SSL, WL, DSL, and PG is in contact with the channel layer CH. One source selection transistor may be defined in an area, in which the source selection line SSL is in contact with the channel layer CH. One memory cell may be defined in an area, in which the word line is in contact with the channel layer CH. One drain selection transistor may be defined in an area, in which the drain selection line DSL is in contact with the channel layer CH. One pipe selection transistor may be defined in an area, in which the pipe gate PG is in contact with the channel layer CH.

According to the aforementioned structure, the cell transistors are connected between the common source line CSL and the bit lines BL. The drain selection transistor, the memory cells, the pipe selection transistor, and the source selection transistor, which are serially connected, configure one cell string and are arranged in a U-form. One memory block includes a plurality of cell strings.

The common source line CSL corresponds to any one of the first and second common source lines CSL1 and CSL2 of FIG. 2. The source line discharge transistor is turned on when a turn-on voltage is applied to the pipe gate PG to connect the common source line CSL to a ground. A voltage of the common source line CSL may be discharged as a ground.

FIG. 7 is a block diagram for describing one cell string ST and a corresponding source line discharge transistor CST within any one memory block among the memory blocks MB1 to MB3 of FIG. 1.

Referring to FIG. 7, the cell string ST Includes cell transistors SST, MC, PT, and DST connected between the common source line CSL and the corresponding bit line BL. The source selection transistor SST is connected to a source selection line SSL. The memory cells MC are connected to the word lines WL. The pipe selection transistor PT is connected to the pipe gate PG. The drain selection transistor DST is connected to a drain selection line DSL.

The common source line CSL is connected to a source line controller 60 and a source line discharge transistor CST. According to the exemplary embodiments of the present disclosure, the source line discharge transistor CST is disposed under the slimming structure SS (see FIG. 2) of the corresponding memory block.

Figure 8:
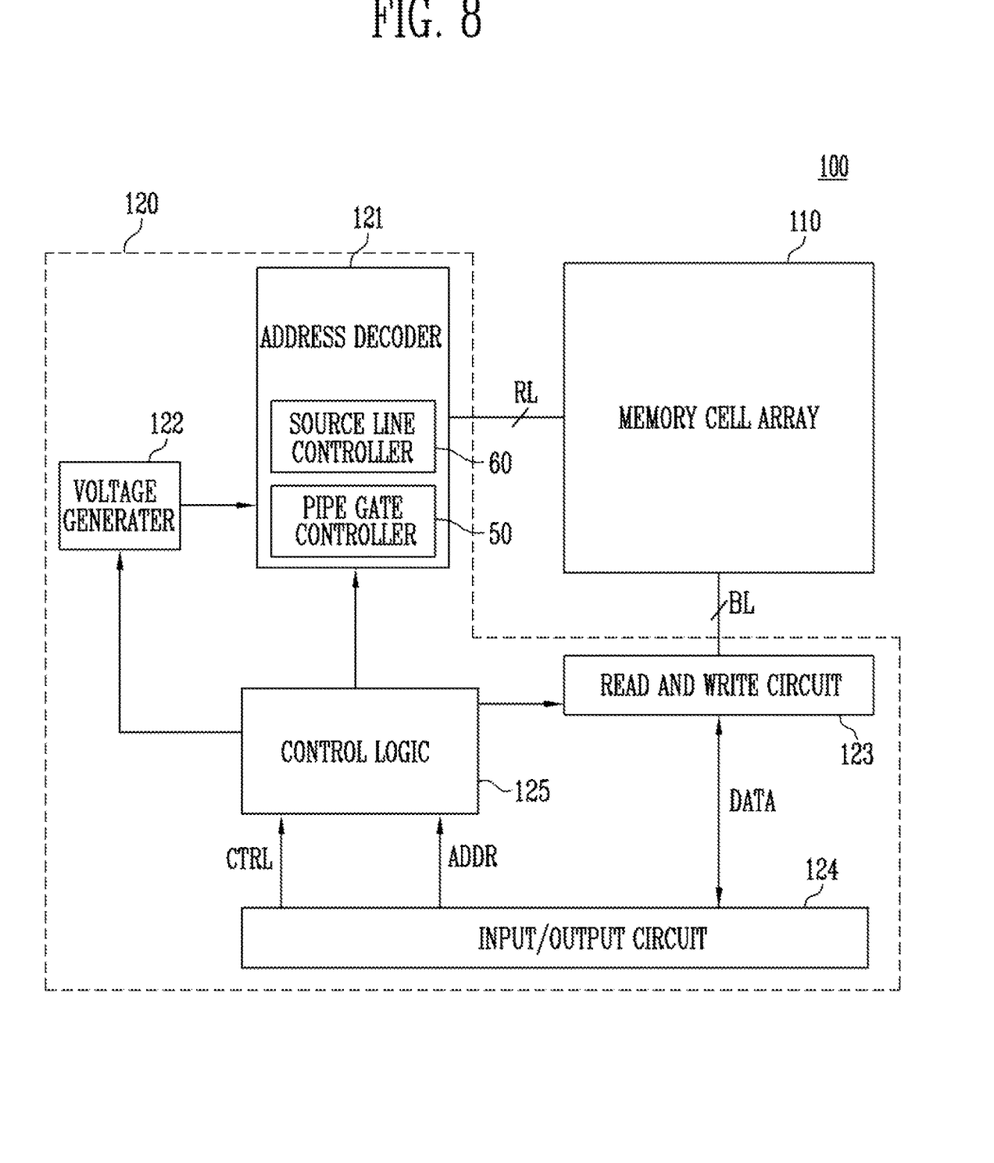
FIG. 8 is a block diagram illustrating a semiconductor device according to an exemplary embodiment of the present disclosure.

The source line discharge transistor CST is connected to the common source line CSL. The source line discharge transistor CST is connected to the ground through a ground line GNDL. A gate of the source line discharge transistor CST is connected to the pipe gate PG. A gate of the pipe selection transistor PT is also connected to the pipe gate PG. As a result, the gate of the source line discharge transistor CST and the gate of the pipe selection transistor PT are commonly connected to the pipe gate PG. Only one cell string ST is illustrated in FIG. 8, but the memory block includes a plurality of cell strings. The gate of the source line discharge transistor CST and the pipe selection transistors PT included in the plurality of corresponding cell strings may be commonly connected to the pipe gate PG.

The pipe selection transistors PT and the source line discharge transistor CST may be commonly controlled by a pipe gate controller 50. When the pipe selection transistors PT is turned on, the source line discharge transistor CST may also be turned on. When the pipe selection transistors PT is turned off, the source line discharge transistor CST may also be turned off.

The source line controller 60 adjusts a voltage of the common source line CSL. For example, during a specific operation of the semiconductor memory device, the source line controller 60 may precharge the common source line CSL. The common source line CSL may be discharged by the source line discharge transistor CST.

FIG. 8 is a block diagram illustrating a semiconductor memory device 100 according to an exemplary embodiment of the present disclosure. Referring to FIG. 8, the semiconductor memory device 100 includes the memory cell array 110 and the peripheral circuit 120.

The memory cell array 110 is connected to an address decoder 121 through row lines RL. The memory cell array 110 is connected to a read and write circuit 123 through the bit lines BL.

The memory cell array 110 includes the plurality of memory blocks MB1 to MB3 (see FIG. 1). Each of the plurality of memory blocks MB1 to MB3 includes a plurality of cell strings. The cell string ST (see FIG. 6) includes a plurality of cell transistors stacked on the semiconductor substrate.

The peripheral circuit 120 includes the address decoder 121, a voltage generator 122, read and write circuit 123, an input/output buffer 124, and a control logic 125.

The address decoder 121 is operated by the control logic 125. The address decoder 121 is connected to the memory cell array 110 through the row lines RL and controls the row lines RL. The row lines RL include the drain selection line DSL (see FIG. 6), the word lines WL (see FIG. 6), the pipe gate PG (see FIG. 6), the source selection line SSL (see FIG. 6), and the common source line CSL (see FIG. 6). The address decoder 121 receives an address ADDR from the control logic 125.

During the program operation and the read operation, the address ADDR includes a block address and a row address. The address decoder 121 is configured to decode the block address in the received address ADDR. The address decoder 121 selects one memory block according to the decoded block address. The address decoder 121 is configured to decode the row address in the received address ADDR. The address decoder 121 selects any one of the drain selection lines of the selected memory block according to the decoded row address, and selects any one of the plurality of word lines of the selected memory block. Accordingly, memory cells corresponding to one page are selected.

As an exemplary embodiment, the address ADDR includes the block address during the erase operation. The address decoder 121 decodes the block address and selects one memory block according to the decoded block address.

The address decoder 121 includes the pipe gate controller 50 and the source line controller 60. During the program operation and the read operation, the pipe gate controller 50 may apply the turn-on voltage to the pipe gate PG of the memory block selected by the block address. The pipe selection transistors of the selected memory block are turned on by the turn-on voltage. According to the exemplary embodiments of the present disclosure, when the pipe selection transistors of the selected memory block are turned on, the source line discharge transistor corresponding to the selected memory block is also turned on. During the erase operation, the pipe gate controller 50 may bias the pipe gate PG to be equal to the word lines WL. The source line controller 60 controls the common source line CSL.

As an exemplary embodiment, the address decoder 121 may include a block decoder, a row decoder, an address buffer, and the like. The voltage generator 122 is operated in response to a control by the control logic 125. The voltage generator 122 generates an internal power voltage by using an external power voltage and supplies the internal power voltage to the semiconductor memory device 100. For example, the voltage generator 122 generates the internal power voltage by regulating the external power voltage. The generated Internal power voltage is provided to the address decoder 121, the read and write circuit 123, the input/output buffer 124, and the control logic 125 and used as an operation voltage of the semiconductor memory device 100.

The voltage generator 122 generates a plurality of voltages by using at least one of the external power voltage and the internal power voltage. As an exemplary embodiment, the voltage generator 122 includes a plurality of pumping capacitors receiving the internal power voltage, and selectively activates the plurality of pumping capacitors in response to the control logic 125 to generate the plurality of voltages. For example, the voltage generator 122 may generate various voltages to be applied to the row lines RL and provide the generated voltages to the address decoder 121.

The read and write circuit 123 is connected to the memory cell array 110 through the bit lines BL. The read and write circuit 123 is configured to control the bit lines BL in response to the control logic 125.

During the erase operation, the read and write circuit 123 may float the bit lines BL. During the program operation, the read and write circuit 123 transmits data DATA to be programmed from the input/output buffer 124 to the bit lines BL. The selected memory cells are programmed according to the transmitted data DATA. During the read operation, the read and write circuit 123 reads the data DATA through the bit lines BL from the selected memory cells and outputs the read data DATA to the input/output buffer 124.

As the exemplary embodiment, the read and write circuit 123 may include the page buffers or page registers, a column selection circuit, and the like. The control logic 125 is connected to the address decoder 121, the voltage generator 122, the read and write circuit 123, and the input/output buffer 124. The control logic 125 receives a control signal CTRL and an address ADDR from the input/output buffer 124. The control logic 125 is configured to control a general operation of the semiconductor memory device 100 in response to the control signal CTRL. The control logic 125 transmits the address ADDR to the address decoder 121.

The input/output buffer 124 receives the control signal CTRL and the address ADDR from the outside and transmits the received control signal CTRL and address ADDR to the control logic 125. The input/output buffer 124 may be configured to transmit the data DATA input from the outside to the read and write circuit 123, or output the data DATA received from the read and write circuit 123 to the outside. As an exemplary embodiment, the semiconductor memory device 100 may be a flash memory device.

According to the exemplary embodiment of the present disclosure, the junctions are provided within the semiconductor substrate under the vertical insulating materials. The junctions are positioned in the region in which the slimming structure SS is formed. Under the slimming structure SS, the junctions define the source line discharge transistors together with the conductive layers adjacent to the semiconductor substrate. The source line discharge transistors are provided under the slimming structure SS, so that a degree of integration of the memory cell array is improved.

The junctions are connected with the common source line through the contact plugs passing through the vertical insulating materials, respectively. The conductive layers adjacent to the semiconductor substrate may be the pipe gates. The common source line, as well as the pipe selection transistors, may be controlled by controlling the pipe gates. Accordingly, the wires connected to the pipe selection transistors and the source line discharge transistors are decreased, and a common control unit for controlling the wires may be provided. Accordingly, an occupied area of the semiconductor memory device is decreased.

As described above, the embodiment has been disclosed in the drawings and the specification. The specific terms used herein are for purposes of illustration, and do not limit the scope of the present disclosure defined in the claims. Accordingly, those skilled in the art will appreciate that various modifications and other equivalent examples may be made without departing from the scope and spirit of the present disclosure as defined in the accompanying claims.

What is claimed is:

1. A semiconductor memory device, comprising:
a slimming structure extended from a cell structure in a direction parallel to a semiconductor substrate, the cell structure having a plurality of cell transistors stacked over the semiconductor substrate;
first and second vertical insulating materials extended in a direction crossing the semiconductor substrate and configured to divide the cell structure and the slimming structure into a plurality of memory blocks;
a first contact plug passing through the first vertical insulating material and a second contact plug passing through the second vertical insulating material, the first and second contact plugs disposed within an area in which the slimming structure is formed; and
a source line discharge transistor including a first junction, a second junction and a gate disposed on the semiconductor substrate between the first and second junctions the first and second junctions formed within the semiconductor substrate and disposed under the first and second vertical insulating materials, respectively,
wherein a lower transistor adjacent to the semiconductor substrate among the cell transistors and the source line discharge transistor share the gate disposed on the semiconductor substrate between the first and second junctions, and
wherein the first and second junctions are spaced apart from one another and are coupled to the first and second contact plugs, respectively.

2. The semiconductor memory device of claim 1,
wherein the plurality of memory blocks includes conductive layers adjacent to the semiconductor substrate.

3. The semiconductor memory device of claim 1,
wherein the plurality of cell transistors is coupled between bit lines and a common source line, and
wherein the first contact plug is coupled to the common source line, the second contact plug is coupled to a ground, and the source line discharge transistor is coupled between the first contact plug and the second contact plug.

4. The semiconductor memory device of claim 1,
wherein the plurality of memory blocks includes conductive layers coupled to the plurality of cell transistors, and interlayer insulating layers alternately stacked with the conductive layers, and
wherein a lower conductive layer adjacent to the semiconductor substrate among the conductive layers is used as the gate shared by the source line discharge transistor and the lower transistor.

5. The semiconductor memory device of claim 4, wherein the plurality of cell transistors is coupled between bit lines and a common source line, and
wherein the first contact plug is coupled to the common source line, the second contact plug is coupled to a ground, and the source line discharge transistor is coupled between the first contact plug and the second contact plug.

6. The semiconductor memory device of claim 4, wherein the lower conductive layer is a pipe gate, and the lower transistor is a pipe selection transistor.

7. The semiconductor memory device of claim 6, wherein when a turn-on voltage is applied to the pipe gate, the pipe selection transistor and the source line discharge transistor are turned on.

8. The semiconductor memory device of claim 4, wherein first cell transistors of the plurality of cell transistors are selection transistors,
wherein first conductive layers of the conductive layers are selection lines and are coupled to the selection transistors,
wherein second cell transistors of the plurality of cell transistors are memory cells,
wherein second conductive layers of the conductive layers are word lines and are coupled to the memory cells, and
wherein the lower conductive layer is a pipe gate.

9. The semiconductor memory device of claim 1, wherein the slimming structure is extended to a selection line contact area, a dummy area, and a word line contact area from the cell structure,
wherein the slimming structure in the selection line contact area and the word line contact area is in a step form, and
wherein the slimming structure in the dummy area has no step.

10. The semiconductor memory device of claim 9, wherein the first and second vertical insulating materials extend to the selection line contact area, the dummy area, and the word line contact area from the cell structure, and
wherein the first and second contact plugs pass through the first and second vertical insulating materials in the dummy area, respectively.

11. The semiconductor memory device of claim 1, wherein the first and second junctions are impurity regions spaced apart from each other.

12. A semiconductor memory device, comprising:
a slimming structure including conductive layers and interlayer insulating layers, wherein the conductive layers are coupled to a plurality of cell transistors, wherein the plurality of cell transistors is stacked over a semiconductor substrate, wherein the interlayer insulating layers are disposed between the conductive layers;
first and second vertical insulating materials extended in a direction crossing an upper surface of the semiconductor substrate and respectively disposed at first and second sides of the slimming structure;
a channel layer passing through the conductive layers and the interlayer insulating layers so that the cell transistors are serially connected;
first and second contact plugs passing through the first and second vertical insulating materials, respectively;
first and second junctions formed in the semiconductor substrate under the first and second vertical insulating materials, respectively, wherein the first junction is spaced apart from the second junction; and
a source line discharge transistor including a gate, the first junction and the second junction, the gate extending from a lower-most conductive layer among the conductive layers and disposed on the semiconductor substrate between the first junction and the second junction so that an electrical connection between the first junction and the second junction is controlled by a voltage applied to the lower-most conductive layer, the lower-most conductive layer surrounding the channel layer, the source line discharge transistor connected to a ground,
wherein the first and second junctions are coupled with the first and second contact plugs, respectively.

13. The semiconductor memory device of claim 12, wherein the lower-most conductive layer is a pipe gate, and
wherein the first junction, the second junction, and the pipe gate provided between the first and the second junctions form the source line discharge transistor.

14. The semiconductor memory device of claim 13, wherein the plurality of cell transistors is coupled between a bit line and a common source line,
wherein the first contact plug is coupled to the common source line,
wherein the second contact plug is coupled to a ground line connected to the ground, and
wherein the source line discharge transistor is provided between the first contact plug and the second contact plug.

15. The semiconductor memory device of claim 14, wherein at least one of the plurality of cell transistors is a pipe selection transistor, and
wherein the lower-most conductive layer serving as the pipe gate is coupled to the pipe selection transistor.

16. The semiconductor memory device of claim 15, wherein when a turn-on voltage is applied to the pipe gate, the pipe selection transistor and the source line discharge transistor are turned on.

17. The semiconductor memory device of claim 12, wherein the slimming structure includes a selection line contact area, a dummy area, and a word line contact area and extends from the plurality of cell transistors,
wherein the slimming structure in the selection line contact area and the word line contact area is patterned in a step form, and
wherein the slimming structure in the dummy area has no step.

18. The semiconductor memory device of claim 17, wherein the first and second vertical insulating materials are extended to the selection line contact area, the dummy area, and the word line contact area from the plurality of cell transistors, and
wherein the first and second contact plugs pass through the first and second vertical insulating materials in the dummy area, respectively.

19. A semiconductor memory device, comprising:
first and second vertical insulating materials provided over a substrate;
a stack including a pipe gate and a slimming structure provided over the substrate between the first and the second vertical insulating materials;
a cell structure extending from the slimming structure, wherein the pipe gate extends from between the substrate and the slimming structure to between the substrate and the cell structure;

a channel layer passing through the cell structure and the pipe gate;

first and second junctions respectively formed in the substrate under the first and the second vertical insulating materials, wherein the first junction is spaced apart from the second junction;

a source line discharge transistor including the first junction, the second junction and a gate extending from the pipe gate;

first and second contact plugs respectively passing through the first and the second vertical insulating materials, and respectively coupled to the first and the second junctions;

a common source line connected to the channel layer and the first junction; and a pipe gate controller applying a turn-on voltage to the pipe gate, wherein the source line discharge transistor electrically connects the common source line to the second junction in response to the turn-on voltage so as to discharge the common source line.

20. The semiconductor memory device of claim 19, wherein the first contact plug couples the first junction to the common source line, and wherein the second contact plug couples the second junction to a ground line.

21. The semiconductor memory device of claim 19, further comprising:

a pipe selection transistor selecting the cell structure, wherein the pipe gate is coupled between the pipe selection transistor and the source line discharge transistor.

* * * * *